(12) United States Patent
Derra et al.

(10) Patent No.: US 8,873,021 B2
(45) Date of Patent: Oct. 28, 2014

(54) DEBRIS MITIGATION SYSTEM WITH IMPROVED GAS DISTRIBUTION

(75) Inventors: Gunther Hans Derra, Aachen (DE); Thomas Krucken, Aachen (DE)

(73) Assignee: Koninklijke Philips N.V., Eindhoven (NL)

( * ) Notice: Subject to any disclaimer, the term of this patent is extended or adjusted under 35 U.S.C. 154(b) by 1098 days.

(21) Appl. No.: 11/917,207

(22) PCT Filed: Jun. 6, 2006

(86) PCT No.: PCT/IB2006/051795
§ 371 (c)(1),
(2), (4) Date: Dec. 12, 2007

(87) PCT Pub. No.: WO2006/134512
PCT Pub. Date: Dec. 21, 2006

(65) Prior Publication Data
US 2008/0212044 A1 Sep. 4, 2008

(30) Foreign Application Priority Data
Jun. 14, 2005 (EP) ..................................... 05105210

(51) Int. Cl.
*B60R 1/06* (2006.01)
*G03B 27/54* (2006.01)
*G03F 7/20* (2006.01)

(52) U.S. Cl.
CPC ........ *G03F 7/70916* (2013.01); *G03F 7/70933* (2013.01); *G03F 7/70883* (2013.01); *G03F 7/70908* (2013.01)
USPC ................................ 355/30; 355/67; 359/507

(58) Field of Classification Search
CPC ............ G03F 7/70033; G03F 7/70175; G03F 7/70883; G03F 7/70908; G03F 7/70916; G03F 7/70933
USPC ................................. 250/251, 492.2, 504 R; 313/231.31–231.71; 315/111.21–111.91; 355/30, 53, 67, 355/71; 359/507–514; 378/34, 119
See application file for complete search history.

(56) References Cited

U.S. PATENT DOCUMENTS

| | | | |
|---|---|---|---|
| 6,586,757 B2 | 7/2003 | Melnychuk et al. | |
| 2002/0084428 A1 | 7/2002 | Visser et al. | |
| 2003/0020890 A1 | 1/2003 | Ogushi et al. | |
| 2004/0089818 A1 | 5/2004 | Bowen et al. | |
| 2004/0108473 A1 | 6/2004 | Melnychuk et al. | |
| 2005/0016679 A1 | 1/2005 | Ruzic et al. | |
| 2005/0098741 A1* | 5/2005 | Bakker et al. | 250/492.2 |
| 2005/0122491 A1* | 6/2005 | Bakker et al. | 355/30 |
| 2006/0012761 A1* | 1/2006 | Bakker et al. | 355/30 |
| 2006/0138362 A1 | 6/2006 | Bakker et al. | |
| 2006/0243927 A1 | 11/2006 | Tran et al. | |

FOREIGN PATENT DOCUMENTS

| | | |
|---|---|---|
| DE | 3808629 C1 | 8/1989 |
| EP | 1274287 A1 | 1/2003 |
| EP | 1391785 A1 | 2/2004 |
| EP | 1434098 A2 | 6/2004 |

(Continued)

*Primary Examiner* — Colin Kreutzer

(57) ABSTRACT

A debris mitigation system for use in a radiation unit for EUV radiation and/or X-rays, for example, includes a foil trap having several passages allowing a straight passage of radiation, and one or several feed pipes for gas supply of buffer gas to the foil trap. The foil trap has an interior space extending over several of the passages, where the feed pipes open into the interior space.

4 Claims, 4 Drawing Sheets

(56) References Cited

FOREIGN PATENT DOCUMENTS

Figure 1:
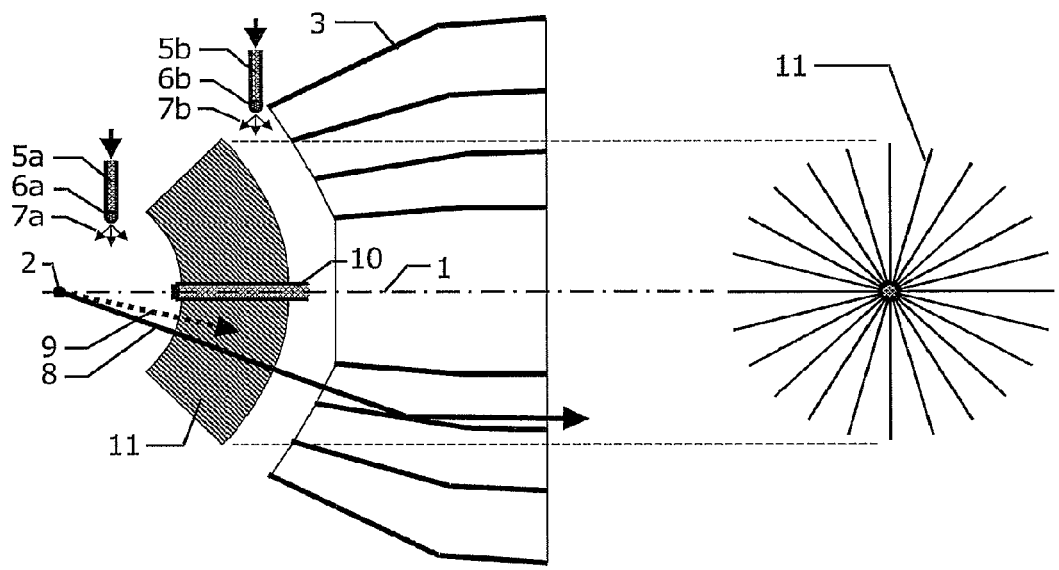

| | | |
|---|---|---|
| EP | 1531365 A1 | 5/2005 |
| EP | 1674932 A1 | 6/2006 |
| JP | 2006186366 A1 | 7/2006 |
| WO | 9942904 A1 | 8/1999 |
| WO | 0101736 A1 | 1/2001 |
| WO | 03026363 A1 | 3/2003 |
| WO | 03034153 A2 | 4/2003 |
| WO | 2004104707 A2 | 12/2004 |
| WO | 2005096099 A2 | 10/2005 |

\* cited by examiner

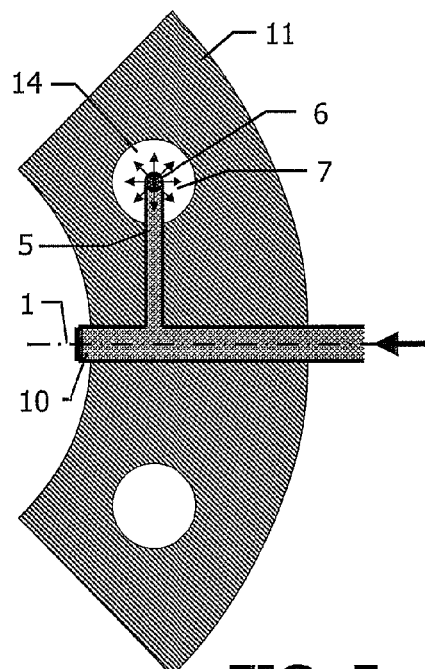
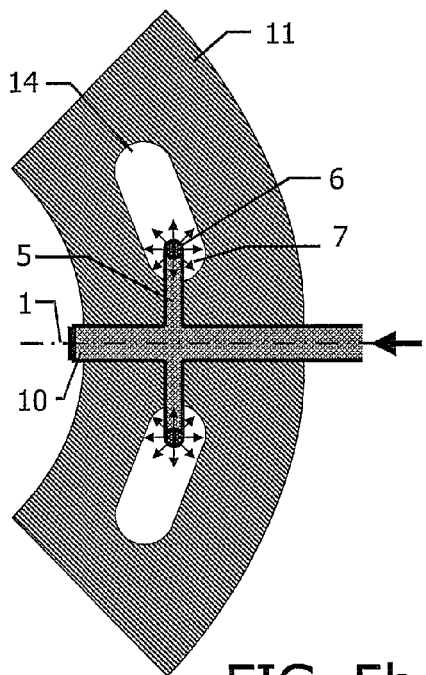
FIG. 5a          FIG. 5b
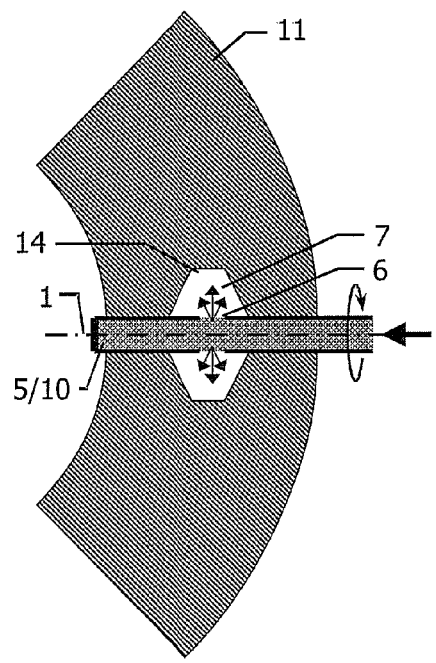
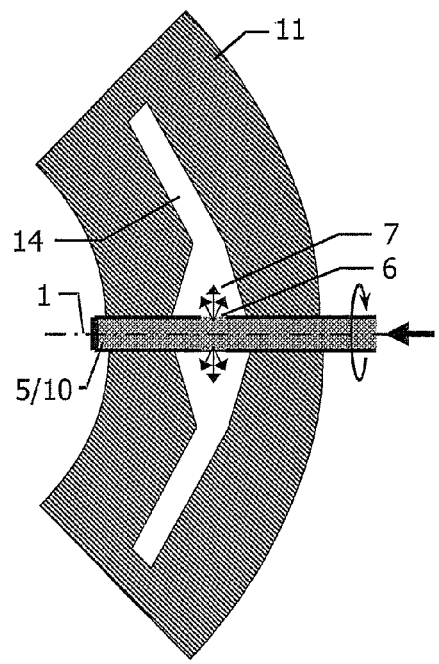
FIG. 6a          FIG. 6b

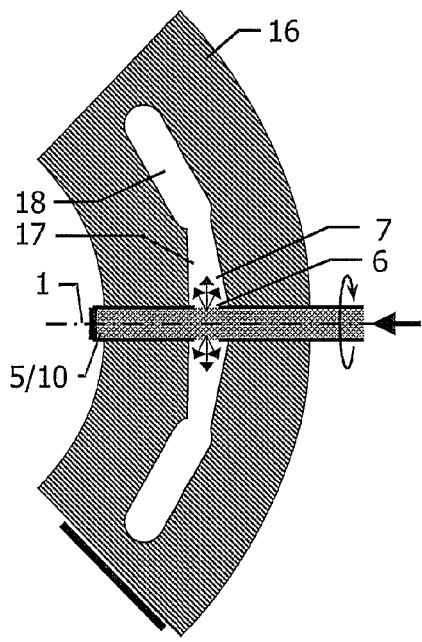
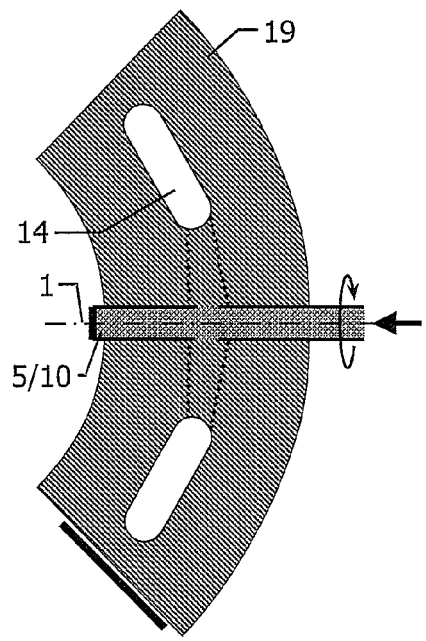
FIG. 7a        FIG. 7b
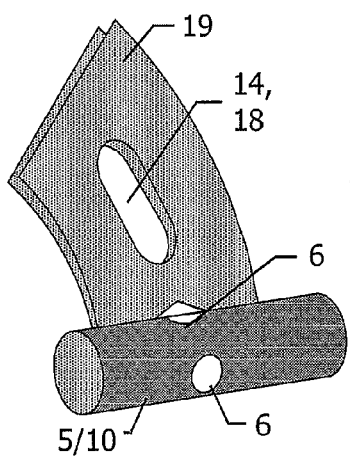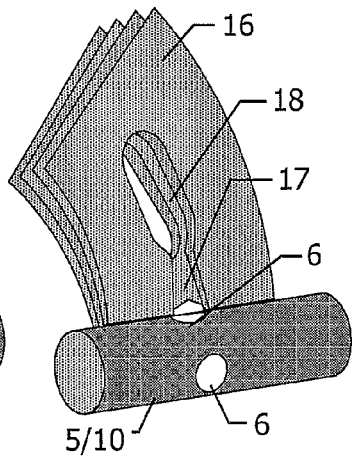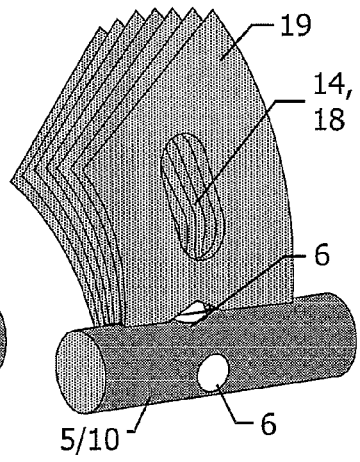
FIG. 8a      FIG. 8b      FIG. 8c

DEBRIS MITIGATION SYSTEM WITH IMPROVED GAS DISTRIBUTION

The present invention relates to a debris mitigation system, in particular for use in a radiation unit for EUV radiation and/or soft X-rays, comprising a debris mitigation unit having several passages allowing a straight passage of radiation and one or several feed pipes for gas supply of buffer gas to said debris mitigation unit. The invention also relates to a debris mitigation unit, in particular a foil trap, which can be used in such a debris mitigation system.

The debris mitigation system of the present invention is in particular applicable in radiation units emitting extreme ultraviolet (EUV) radiation or soft X-rays in the wavelength range between approximately 1 nm to 20 nm. An exemplary application field is EUV-lithography required for fabrication of integrated circuits with structures having dimensions of only a few nanometers.

EUV-radiation units for EUV-lithography comprise as key elements a radiation source emitting the EUV radiation and illumination optics for projecting the structure of a mask onto a wafer substrate. In the case of EUV-lithography, the optical components are reflective mirrors since effective transmissive optical components are not known for this wavelength region. The required EUV radiation is generated by a plasma discharge which forms the radiation source of the radiation unit. Apart from the EUV radiation such a plasma, however, also emits charged or uncharged particles which can deposit on the optical surfaces of the illumination optics. Dependent on the kind of EUV radiation source these particles can comprise neutral atoms, ions, clusters or drop-lets of different chemical consistence. The totality of such undesired particle emissions of an EUV radiation source is also called debris. In an EUV-radiation unit, the collector mirror close to the radiation source is mainly contaminated by such debris. In order to minimize the contamination, debris mitigation systems are used between the radiation source and the optical components, in particular the collector mirror, of such a radiation unit.

A known method of debris mitigation is the supply of a buffer gas between the EUV radiation source and the collector mirror. The debris particles, in the case of atoms or ions, are slowed down by the collisions with the gas atoms and are deflected from their original flight direction. With a sufficient high density of the buffer gas the debris particles can be completely stopped on their way to the collector mirror. If the debris also contains condensable matter, for example metal atoms or metal droplets, an additional debris mitigation unit is used between the EUV radiation source and the collector mirror. Such a debris mitigation unit comprises a structure having passages for the straight passage of the radiation to the collector mirror, wherein the debris material is mainly condensed on the walls of this structure and therefore does not reach the collector mirror.

Known debris mitigation units comprise several thin sheets arranged in a parallel, concentric or honeycomb structure forming manner, see for example WO 01/01736 A1. Such debris mitigation units are also called foil traps.

WO 03/034153 A1 discloses an embodiment of a debris mitigation system, in which the foil trap is divided in two parts by an intermediate space. The buffer gas is fed to this intermediate space. Due to this construction, the volume for plasma generation and the volume containing the collector mirror can be maintained at a low pressure while the buffer gas in the intermediate space can be supplied with a higher pressure in order to effectively slow down the debris particles.

U.S. Pat. No. 6,586,757 B2 shows a further example for a debris mitigation unit separated by an intermediate space. In this case the buffer gas is supplied from the side of the collector mirror and pumped out through an opening in the intermediate space. The buffer gas pressure is therefore higher on the side of the collector mirror than in this intermediate space of the foil trap.

In order to effectively suppress the debris particles, a pressure of the buffer gas of approximately 10 to 100 Pa (cold pressure) over an interaction distance of several centimeters is required. The atomic weight of the gas atoms should be similar to the atomic weight of the atoms and ions to be stopped in order to ensure an effective momentum transfer. Most of the known solutions of debris mitigation systems in practice do not reach the above high pressures necessary for an effective debris mitigation.

An object of the present invention is to provide a debris mitigation system, in particular for a radiation unit emitting EUV radiation or soft X-rays, which provides an improved debris mitigation.

The present debris mitigation system comprises a debris mitigation unit, in particular a foil trap, said debris mitigation unit having several free passages allowing a straight passage of radiation through the mitigation unit, and one or several feed pipes for gas supply of a buffer gas to said debris mitigation unit. The debris mitigation unit has at least one interior space extending over several passages, preferably perpendicular to said passages, wherein said feed pipes open into said space. The interior space preferably extends over all passages of the mitigation unit.

In the present invention the buffer gas is supplied directly into said one or several interior spaces of the debris mitigation unit, so that the pressure of the buffer gas has a maximum inside this debris mitigation unit compared with the outside space. Therefore it is possible to maintain a sufficiently high pressure of this buffer gas required for efficient debris mitigation within the foil trap while maintaining a required low pressure in the volume of the radiation source and the optical components of a radiation unit, for example an EUV-radiation unit. It has been found that a product of the buffer gas pressure p and an interaction length d of at least 100 to 200 Pa*cm (with reference to normal temperature of 300 K) has to be maintained in order to ensure an effective slowing down or stopping of debris particles emitted from an EUV radiation plasma source. Such a product of pressure p and interaction length d can be achieved with the present debris mitigation system without negatively influencing the plasma generation.

The debris mitigation unit of the present system, except for the at least one interior space, is preferably constructed as a usual foil trap known in the art, in particular with a central axis from which the foils extend in a radial direction. According to the invention, in such a foil trap, the interior space is simply formed by openings in the single foils. The supply of the buffer gas can be arranged from the outside or through the central axis of this foil trap. In the latter case the feed pipe forms this central axis and has adequate openings or side tubes extending from the central axis into the interior space.

If such a foil trap is designed to be symmetrical about a central axis, it is also possible to rotate the foil trap around this central axis. Due to the rotation also clusters or droplets which cannot be stopped with the buffer gas collide with the foils of the foil trap and condense there. In the combination of such a rotation of the foil trap with the interior space, to which the buffer gas is directly supplied, a very effective debris mitigation system is provided.

It is evident for the skilled person that the present debris mitigation system is not only applicable to an EUV-radiation unit as mainly described in the present description, but also to any other application that may require debris mitigation.

In the present description and claims the word "comprising" does not exclude other elements or steps and neither does "a" or "an" exclude a plurality. Also any reference signs in the claims shall not be construed as limiting the scope of these claims.

Figure 2:
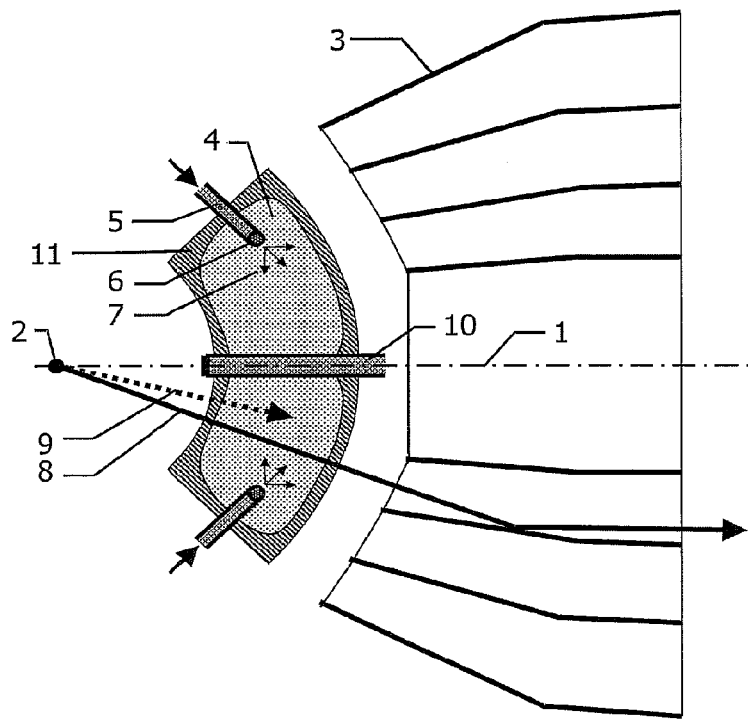
Figures 3A, 3B:
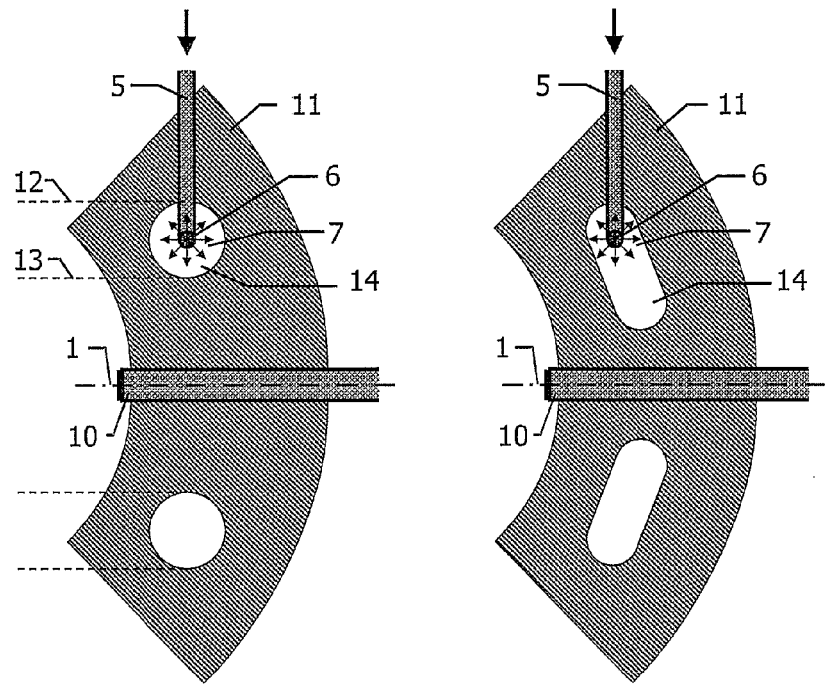
Figure 4:
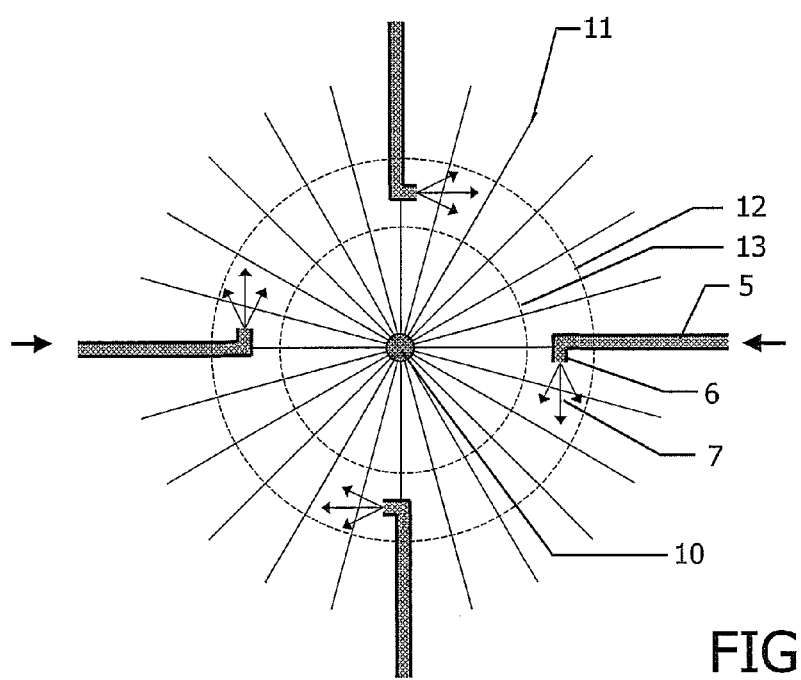

The present debris mitigation system and the corresponding debris mitigation unit are also described in connection with the following drawings in some exemplary embodiments without limiting the scope of the claims. The figures show:

FIG. 1 a schematic view of a known debris mitigation system;

FIG. 2 a schematic view of a first embodiment of the debris mitigation system according to the present invention;

FIG. 3 a schematic view of a second and a third embodiment of the debris mitigation system according to the present invention;

FIG. 4 a schematic view of the debris mitigation system of FIG. 3 in the direction of the central axis;

FIG. 5 a schematic view of a fourth and a fifth embodiment of the debris mitigation system according to the present invention;

FIG. 6 a schematic view of two further embodiments of the debris mitigation system according to the present invention;

FIG. 7 a schematic view of a further embodiment of the debris mitigation system according to the present invention; and FIG. 8 an example showing the construction of the foils of a debris mitigation unit of the debris mitigation system of FIG. 7.

FIG. 1 shows a schematic view of a debris mitigation system with a foil trap in an EUV-radiation unit as known in the art. The figure as well as most of the following figures shows an EUV plasma source 2 as the radiation source emitting EUV radiation which is collected and focused with the collector mirror 3. The optical axis is depicted with reference sign 1, one exemplary radiation path of the EUV radiation having reference sign 8 and one exemplary path of a debris particle having reference sign 9.

The debris mitigation system comprises a foil trap 11 arranged between the EUV plasma source 2 and the collector mirror 3. The foil trap 11 comprises a plurality of single foils extending in radial direction from a central axis 10 of the foil trap 11. This can be seen on the right side of FIG. 1 representing a view in the direction of the central axis 10. The whole arrangement has a rotational symmetry around the optical axis 1.

The debris mitigation system of FIG. 1 also comprises feed pipes 5 for the supply of a buffer gas 7 through outlet openings 6. These feed pipes 5 are arranged to supply the buffer gas in the space between the foil trap 11 and the collector mirror 3 and in the space between the foil trap 11 and the EUV plasma source 2.

With such an arrangement, however, the maximum density of the buffer gas required for an effective stop of the debris particles cannot be achieved at the side of the EUV plasma source 2. The reason is that a EUV plasma source 2 operating for example with a tin discharge only operates efficiently with a maximum buffer gas pressure in the order of 1 Pa of argon gas. At higher pressure the EUV radiation efficiency decreases significantly. Therefore, the required condition for the buffer gas pressure p and interaction length d as already described before, cannot be achieved with such an arrangement. On the side of the collector mirror 3, since the flow resistance of the collector mirror is very low compared to the flow resistance of the foil trap, it would be necessary to provide the buffer gas with a very high gas flow to achieve the required high pressure in the foil trap. Since all available buffer gases absorb EUV radiation, such a high gas flow results in a significant weakening of the EUV radiation which cannot be tolerated.

FIG. 2 shows an exemplary embodiment of a debris mitigation system according to the present invention. The foil trap 11 of this debris mitigation system comprises an interior space 4 to which the buffer gas 7 is directly supplied through the feed pipes 5. To this end, the feed pipes 5 extend into this interior space 4. The buffer gas 7 therefore has its maximum gas density inside the foil trap. This enables a maximum mitigation of debris at a relatively low gas flow. Therefore, the condition of a relatively low gas pressure in the region of the EUV plasma source 2 and in the region of the collector mirror 3 can be fulfilled at the same time.

FIG. 3 shows two further embodiments of the present debris mitigation system in a similar schematic view. The interior space 4 is in this case formed by a circumferential gas flow channel 14 which can have different cross sections as can be seen for example comparing FIGS. 3a and 3b. The circumferential gas flow channel 14 is formed by adequate cutouts in the foils of the foil trap 11. The buffer gas can flow easily in the circumferential direction (azimuth direction) in the gas flow channel 14. This results in the desired homogenous gas distribution in the volume of the foil trap 11 and also in a maximum of the gas pressure within the foil trap 11. Also in these embodiments the gas pipes 5 extend directly into the interior space 4.

FIG. 4 shows a front view of the embodiments of FIG. 3 in the direction of the central axis 10. In this figure the single foils of the foil traps 11 extending in a radial direction from the central axis 10 are shown. The outlet portions of the feed pipes 5 are arranged such that the buffer gas 7 streams out in one and the same circumferential direction into the flow gas channel 14, which is indicated by its outer and inner limiting lines 12, 13 in this figure.

FIG. 5 shows two further embodiments of the present debris mitigation system in a schematic view. The interior space 4 is formed in the same manner as already shown in the examples of FIG. 3. The two embodiments of FIG. 5 show two different cross sections of the flow gas channel 14. The difference between the embodiments of FIG. 5 and the embodiments of FIG. 3 is the arrangement of the feed pipes 5. In the present embodiments one portion of the feed pipe 5 forms the central axis 10 of the foil trap 11 and has one or several side tubes extending into gas flow channel 14. In such an embodiment, a rotation of the foil trap 11 around the central axis 10 is possible since the feed pipes 5 rotate together with the foil trap 11.

Such a rotation is indicated with arrows in the embodiments of FIG. 6. In these embodiments the interior space 4 extends up to the central axis 10 so that side tubes of the feed pipe 5 as shown in FIG. 5 are not required. The buffer gas 7 is fed directly to the interior space 4 by outlet openings in the central feed pipe 5. This results in the advantage compared to the embodiments of FIG. 5 that undesired unbalances due to the rotation of side tubes does not occur. Furthermore, no gas tubes disturb the optical path of the radiation. This embodiment has the further advantage that such a mitigation unit can be easily manufactured. FIG. 6 also shows two further examples for the form of the interior space 4.

FIG. 7 shows a further embodiment in which the circumferential flow channel 18 is connected to the feed pipe 5 of the central axis 10 by single connection passages 17 formed by the interior space. This is achieved by different types of foils of the foil trap 11 having different cutout forms as can be seen in FIGS. 7a and 7b. With such an embodiment an improved debris mitigation is achieved since the interior space, i.e. flow channel 18 and connection passages 17, takes up less foil surface necessary for condensation of debris material.

FIG. 8 shows the different cutouts or openings in the foils of the embodiment of FIG. 7 in different views. FIG. 8a shows two adjacent foils 19 of the foil trap 11 with openings forming the circumferential flow channel 18 for azimuth gas distribution. FIG. 8b shows the continuing foils 16 with the openings for the radial gas supply from the central axis 10 to the circumferential gas flow channel 18. FIG. 8c shows the continuing foils 19 with openings forming again only the circumferential flow channel 18. Continuing in this manner the whole foil trap 11 is formed.

LIST OF REFERENCE SIGNS

1 optical axis
2 EUV plasma source
3 collector mirror
4 interior space for buffer gas
5 feed pipe
6 outlet opening
7 buffer gas
8 radiation path
9 path of debris particles
10 central axis of the foil trap
11 foil trap
12 outer limiting line
13 inner limiting line
14 gas flow channel
16 foil with opening for radial gas supply
17 connecting passages
18 circumferential gas flow channel
19 foil with opening for circumferential gas supply

The invention claimed is:

1. A debris mitigation system comprising a debris mitigation unit including a foil trap, said debris mitigation unit having passages allowing a straight passage of radiation, and one or several feed pipes for gas supply of a buffer gas to said debris mitigation unit, wherein said debris mitigation unit has an interior space extending over several of said passages and wherein said feed pipes open into said interior space via outlet portions, wherein said foil trap comprises a plurality of foils extending in a radial direction from a central axis, and said interior space is formed by openings in said plurality of foils that are aligned with each other to form a circumferential gas flow channel for flow of the buffer gas in the circumferential gas flow channel in a circumferential direction around said central axis, and wherein at least one outlet portion of said outlet portions of said feed pipes includes a first part and a second part which are located in the circumferential gas flow channel, the second part being perpendicular to the first part to enhance the flow of the buffer gas in the circumferential gas flow channel in the circumferential direction.

2. The debris mitigation system according to claim 1, wherein said debris mitigation unit has essentially rotational symmetry about said central axis.

3. The debris mitigation system according to claim 1, wherein said interior space further forms connection channels extending in the radial direction and connecting said one or several openings to said circumferential gas flow channel.

4. The debris mitigation system according to claim 2, wherein said debris mitigation unit is mounted rotatably around said central axis.

* * * * *